United States Patent [19]

China et al.

[11] Patent Number: 4,975,545

[45] Date of Patent: Dec. 4, 1990

[54] SEALED RELAY ASSEMBLY

[75] Inventors: Endy China, Seneca Falls, N.Y.; Alan Lo, Royal Oak, Mich.

[73] Assignee: Wickes Manufacturing Company, Southfield, Mich.

[21] Appl. No.: 221,590

[22] Filed: Jul. 20, 1988

[51] Int. Cl.[5] .................... H05K 5/00

[52] U.S. Cl. .................... 174/52.1; 200/302.1; 335/202; 29/593

[58] Field of Search .................... 174/52.3, 52.1, 17 VA; 29/593, 602.1; 335/202, 260, 278, 294; 200/302.1

[56] References Cited

U.S. PATENT DOCUMENTS

| | | | |
|---|---|---|---|
| 3,196,322 | 7/1965 | Harper | 335/260 X |
| 4,350,856 | 9/1982 | Shiratori et al. | 174/17 VA |
| 4,454,493 | 6/1984 | Ubukata et al. | 337/381 X |

FOREIGN PATENT DOCUMENTS

| | | | |
|---|---|---|---|
| 2618492 | 11/1977 | Fed. Rep. of Germany | 174/52.3 |

OTHER PUBLICATIONS

Amaro *Back Sealing Electronic Modules,* IBM Tech. Dis. Bulletin; vol. 18, No. 3, pp. 751-752, Aug. 1975.

Harris *Backseal Leak-in Prevention System,* IBM Tech. Dis. Bulletin, vol. 21, No. 10, pp. 3972-3973, Mar. 1979.

*Primary Examiner*—Leo P. Picard
*Assistant Examiner*—David A. Tone
*Attorney, Agent, or Firm*—David A. Greenlee

[57] ABSTRACT

A relay assembly is provided which is sealed against undesirable contaminants. The assembly includes a rigid housing having an opening, an electromagnetic relay positioned within the housing, and a cover membrane sealed to the housing and preventing contaminants from entering the housing through the opening. The relay includes contacts which project through the housing opening and through small contact openings, defined in the membrane. The relay assembly is assembled by pushing the contacts of the relay through the contact openings of the membrane, and then mounting the relay/membrane assembly to the housing.

19 Claims, 1 Drawing Sheet

SEALED RELAY ASSEMBLY

BACKGROUND OF THE INVENTION

The invention relates to a relay assembly including a housing for protecting a relay during soldering and coating operations and from contamination during its operating life.

Electromagnetic relays are commonly employed in automotive applications for controlling the operation of components such as horns, fans and other parts. When incorporated within motor vehicles, they are subject to damage or contamination from air-borne materials during the operating lives thereof. Protection of the relays is also desirable during soldering and coating operations once the units have been mounted to printed circuit boards. Relay housings have, however, often included openings through which the blades or contacts extend. Such openings admit the entrance of contaminants which may affect the operations of the internal parts of the relays (e.g., the armature, lead spring and contact asssembly).

SUMMARY OF THE INVENTION

It is an object of the invention to provide a relay housing for a motor vehicle or the like which protects the internal components of a relay, yet allows the relay to be employed without change in vehicle assembly procedures or to the internal components thereof.

It is another object of the invention to provide a relay housing which can be constructed economically, the housing including a cover which can be assembled thereto using automatic assembly equipment.

In accordance with these and other objects, a relay assembly is provided which includes a substantially rigid housing having an opening at one end thereof, a relay mounted with the housing, the relay including a plurality of contacts extending through the opening and outside the housing, and a thin cover membrane adhered to said one end of the housing, the membrane including a plurality of small openings therein through which the contacts extend.

The membrane is preferably resilient and the openings therein either the same size or slightly smaller than the relay contacts extending therethrough. Contaminants are thereby substantially precluded from entering the housing.

An assembly process is also provided by the invention for manufacturing a relay assembly which is protected from air-borne contaminants. The method include the step of providing a cover membrane having pre-punched openings, pushing the contacts of an electromagnetic relay through the pre-punched openings of the cover membrane, inserting the relay into a housing through an opening therein, and sealing the cover membrane to the housing, thereby covering the housing opening.

DETAILED DESCRIPTION OF THE INVENTION

Figure 1:
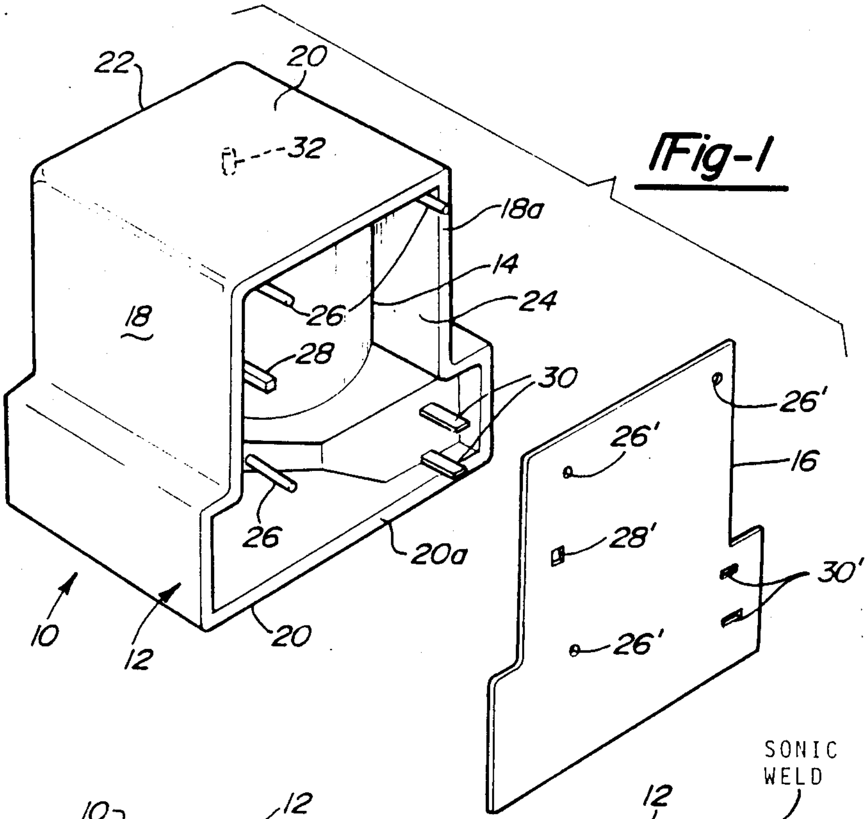
FIG. 1 is an exploded, rear perspective view of a relay assembly in accordance with the invention.
Figure 2:
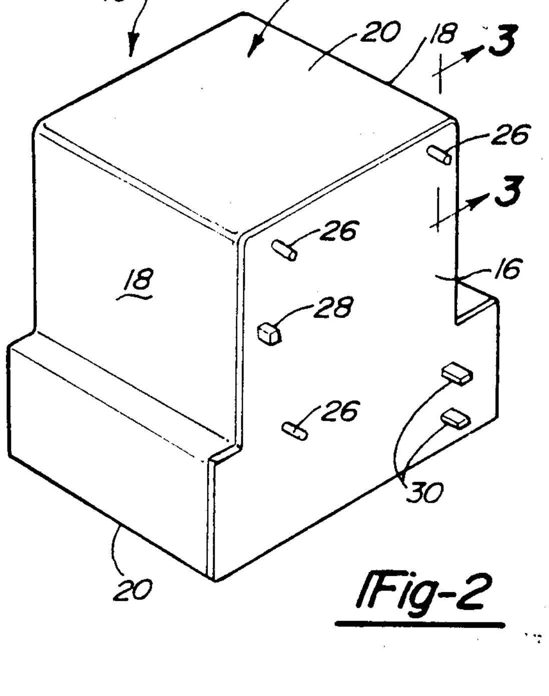
FIG. 2 is a rear perspective view of the relay assembly shown in FIG. 1, the cover membrane being secured thereto.

A relay assembly 10 is shown in FIGS. 1–2, the assembly including a substantially rigid, plastic housing 12, an electromagnetic relay 14 mounted within the housing, and a cover membrane 16 secured to the housing. The cover membrane is preferably made from a nylon film such as DuPont Z101 nylon film or Allied Chemical's CAPRON. Other polyester materials may alternatively be employed. It is preferably between 0.1 and 0.2 mm in thickness, the thickness and material being chosen to provide a flexible, resilient cover which can be subjected to a punching operation. It may also be transparent or translucent.

The housing 12 includes two pairs of opposing side walls 18, 20, a top wall 22, and a bottom opening 24. The opening is defined by the rear edges 18A, 20A of the side walls 18, 20, these edges being substantially coplanar. The peripheral portions of one side of the cover membrane are sealed to the edges defining the housing opening 24, preferably via sonic welding. An adhesive may alternatively be employed.

A plurality of contacts 26, 28, 30 extend from the relay 14 and project outside the housing 12 through the opening 24 therein. The contacts may be circular, square, or rectangular in cross section as shown in FIG. 1. They are used for connecting the relay 14 to a printed circuit board (not shown) or the like. The thickness of the contacts must be sufficient to withstand the shear forces to which they may be subjected during installation and use of the relay assembly.

Figure 3:
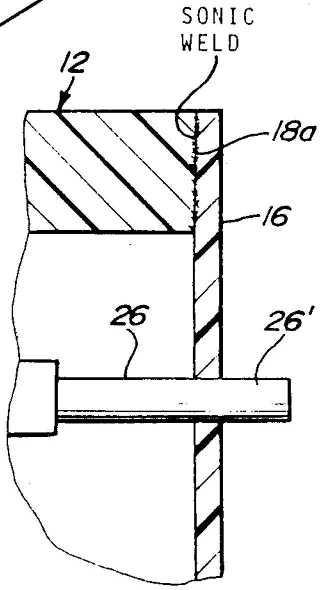
FIG. 3 is an enlarged sectional view thereof taken along line 3—3 of FIG. 2.

The cover membrane 16 includes a plurality of openings 26', 28', 30' which correspond in shape to the cross sectional configuration of the relay contacts. Each such opening preferably has the same dimensions, respectively, as the cross sections of the relay contacts or are slightly smaller. As shown in FIGS. 2 and 3, there is virtually no space between the contacts and the cover membrane 16 which would allow contaminants to pass therethrough.

A small vent opening 32 is provided within the top wall 22 of the housing. The vent opening is preferably covered with a piece of tape or the like until after the assembly operations have been completed. Alternatively, the housing can be molded to include a piece to be broken away after assembly or a thin cross section that can be lanced through, thereby creating a vent opening.

The relay assembly 10 may be manufactured by providing the cover membranes on a reel in pre-cut and pre-punched form, and feeding them to a relay test station. As the operator pushes each relay 14 into the tester, the contacts 26, 28, 30 thereof are pushed through the corresponding openings 26', 28', 30' in the membrane. Once the test has been completed, the relay/membrane assembly is mounted to the housing 12, the relay being positioned within the housing while the membrane 16 abuts the edges 18A, 20A defining the opening 24. This unit is placed on a weld and test table which sonically welds the membrane 16 to the housing 12 and tests the integrity of the seal.

Alternatively, the membrane material can be dereeled and become the conduit for an in-line fully automated system where the following operations can be sequentially performed:

1. The terminal slots are punched.
2. The relay is mounted through the slots.

3. The relay is tested for electrical integrity.
4. The cover is mounted over the relay.
5. The housing is sonically sealed to the membrane.
6. The relay is separate from the membrane.
7. The sonic seal tested and the relay assembly packed for shipment.

The final assembly 10, as shown in FIG. 2, is particularly suitable for applications where limited space is available and extending the lengths of the relay contacts would not be an acceptable procedure for allowing the installation of a relatively large cover. By employing a cover membrane 16 to protect against contaminants, the dimensions of the contacts and relay assembly can remain substantially unchanged. The contacts may be inserted within the openings in a printed circuit board in the same manner as if no cover were employed. The cover membrane is manufactured and installed without incurring significant additional costs or adding to the height of the relay assembly. It is accordingly an extremely effective means for protecting against contaminants.

What is claimed is:

1. A relay assembly comprising: a housing having peripheral walls; an opening defined within the housing; a cover membrane having a plurality of contact openings, the membrane covering the housing opening and being secured only to the housing peripheral walls; and a relay positioned within the housing and including contacts extending therefrom through the membrane contact openings and projecting outside the housing.

2. A relay assembly as defined in claim 1 wherein the cover membrane is about 0.1–0.2 mm in thickness.

3. A relay assembly as defined in claim 2 wherein the cover membrane is made from nylon.

4. A relay assembly as defined in claim 2 wherein the cover membrane is translucent.

5. A relay assembly as defined in claim 1 wherein the cover membrane is resilient.

6. A relay assembly as defined in claim 5 wherein the housing is substantially rigid.

7. A relay assembly as defined in claim 1 including a vent opening within the housing, the vent opening being substantially smaller than the openings through which the contacts extend.

8. A relay assembly as defined in claim 1 wherein the contact openings are of the same dimensions or smaller than the respective cross sectional dimensions of the contacts which extend therethrough.

9. A relay assembly as defined in claim 8 wherein the cover membrane is resilient.

10. A relay assembly as defined in claim 9 wherein the cover membrane is about 0.1–0.2 mm in thickness and made from a thermoplastic material.

11. A relay assembly as defined in claim 1 wherein the housing peripheral walls include two pairs of side walls and a top wall adjoining the side walls, the side walls include bottom edges defining the housing opening, the bottom edges are substantially coplanar, and the cover membrane is secured to the bottom edges.

12. A relay assembly as defined in claim 11 including a vent opening within the top wall.

13. A relay assembly as defined in claim 11 wherein the cover membrane is resilient.

14. A relay assembly as defined in claim 13 wherein the housing is substantially rigid.

15. A relay assembly as defined in claim 13 wherein the cover membrane is about 0.1–0:2 mm in thickness.

16. A method of assembling a relay assembly comprising the steps of:

providing an electromagnetic relay having a plurality of contacts extending therefrom;

providing a thin, flexible membrane having a plurality of contact openings therein;

inserting said contacts through the contact openings in the membrane;

providing a housing having walls defining a relay chamber and an opening leading to the relay chamber;

inserting the relay within the relay chamber such that the contacts project outside the housing through the opening within the housing; and securing the membrane only to the housing walls to close the housing opening.

17. A method as defined in claim 16 wherein the membrane is between 0.1–0.2 mm in thickness.

18. A method as defined in claim 16 wherein the contacts are inserted through the contact openings as the relay contacts is pushed into a relay tester.

19. A relay assembly comprising;

a housing;

an opening defined within said housing;

a relay positioned within said housing said relay including contacts extending therefrom and projecting outside said housing and through said opening;

a cover membrane having a plurality of contact openings therein, said contacts extending, respectively, through said contact openings, said cover membrane being secured to said housing and covering said opening; and a vent opening within said housing, said vent opening being substantially smaller than said openings through which said contact extend.

* * * * *